United States Patent [19]

Thillays

[11] Patent Number: 5,233,208

[45] Date of Patent: Aug. 3, 1993

[54] PHOTOCOUPLER SURROUNDED BY TRANSPARENT AND REFLECTIVE RESINS IN A PREFORMED PIN HOUSING

[75] Inventor: Jacques Thillays, Herouville, France

[73] Assignee: U.S. Philips Corp., New York, N.Y.

[21] Appl. No.: 979,392

[22] Filed: Nov. 19, 1992

Related U.S. Application Data

[63] Continuation of Ser. No. 664,077, Mar. 4, 1991, abandoned.

[30] Foreign Application Priority Data

Mar. 23, 1990 [FR] France ............... 90 03735

[51] Int. Cl.$^5$ ................... H01L 31/12; H01L 31/16
[52] U.S. Cl. ............................. 257/82; 257/693
[58] Field of Search ............. 357/19, 74; 257/82, 257/81, 80, 693

[56] References Cited

U.S. PATENT DOCUMENTS

| | | | |
|---|---|---|---|
| 3,806,766 | 4/1974 | Fanning | 357/72 |
| 4,047,045 | 9/1977 | Paxton, Jr. et al. | 357/19 |
| 4,829,192 | 5/1989 | Kokubu | 357/19 |
| 4,980,568 | 12/1990 | Merrick et al. | 357/19 |

FOREIGN PATENT DOCUMENTS

| | | | |
|---|---|---|---|
| 103032 | 3/1984 | European Pat. Off. | |
| 2262407 | 9/1975 | France | |
| 59-87880 | 5/1984 | Japan | |
| 60-37789 | 2/1985 | Japan | 357/19 |
| 61-53786 | 3/1986 | Japan | 357/19 |
| 61-296777 | 12/1986 | Japan | 357/19 |
| 62-156882 | 7/1987 | Japan | 357/19 |
| 63-65683 | 3/1988 | Japan | 357/74 |
| 63-88873 | 4/1988 | Japan | 357/74 |
| 63-88874 | 4/1988 | Japan | 357/74 |
| 63-240082 | 10/1988 | Japan | 357/19 |
| 3-27576 | 2/1991 | Japan | 357/14 |

*Primary Examiner*—Jerome Jackson
*Assistant Examiner*—D. Monin
*Attorney, Agent, or Firm*—Steven R. Biren

[57] ABSTRACT

The invention relates to a photocoupler comprising a light emitting element and a light receiving element, the light emitting element having a first and a second electrode in electrical contact with a first and a second contact pin, respectively, by means of which the light emitting element is fixed in position, the light receiving element having a third and a fourth electrode in electrical contact with a third and a fourth contact pin, respectively, by means of which the light receiving element is fixed in position. The light emitting element and the light receiving element are situated opposite one another and enveloped in a first solid and transparent layer, surrounded at least in part by a second solid layer provided in such a manner as to reflect the light. According to the invention, a pre-formed housing has a bottom and side walls, the bottom having at least one cavity which accommodates a first end of the first, second, third and fourth pin and a first, second, third and fourth slot in which central portions of the first, second, third and fourth pins, respectively, are held.

11 Claims, 1 Drawing Sheet

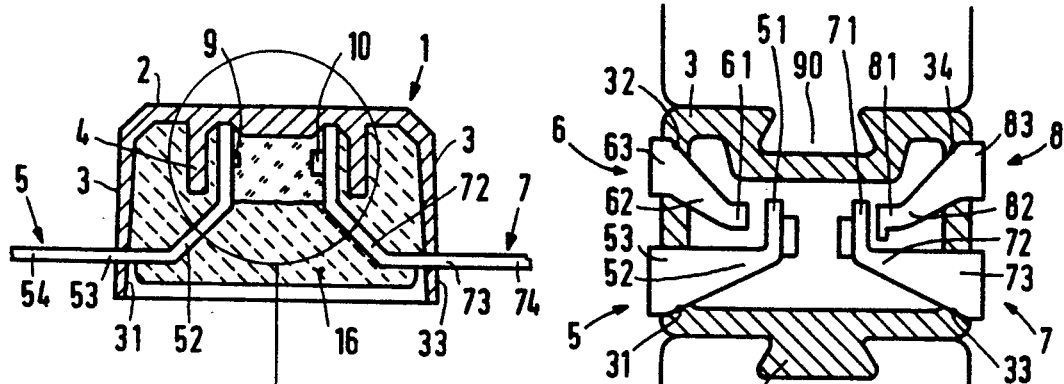
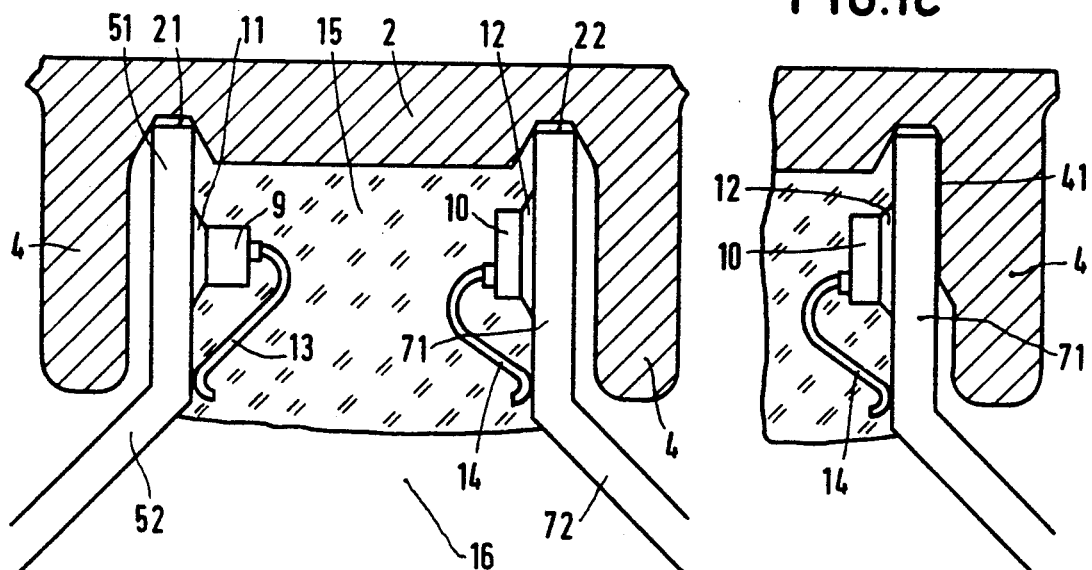
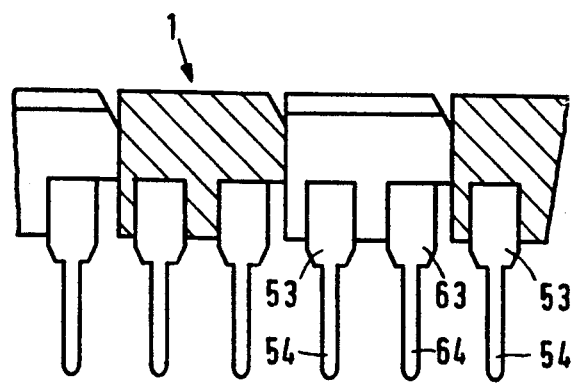
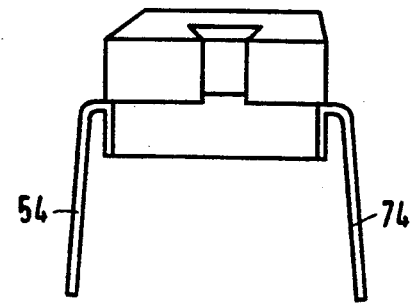

PHOTOCOUPLER SURROUNDED BY TRANSPARENT AND REFLECTIVE RESINS IN A PREFORMED PIN HOUSING

This is a continuation of application Ser. No. 07/664,077 filed Mar. 4, 1991, now abandoned.

BACKGROUND OF THE INVENTION

The invention relates to a photocoupler comprising a light emitting element and a light receiving element, the light emitting element having a first and a second electrode in electrical contact with a first and a second contact pin, respectively, by means of which the light receiving element is fixed in position, the light receiving element having a third and a fourth electrode in electrical contact with a third and a fourth contact pin, respectively, by means of which the light receiving element is fixed in position, while the light emitting element and the light receiving element are situated opposite one another and enveloped in a first solid and transparent layer, surrounded at least in part by a second solid layer provided in such a manner as to reflect the light.

Such a device is known from French Patent Application FR-2 262 407 filed on Feb. 22th 1974. In this document, the second resin is rendered reflective by the fact that its refractive index is lower than that of the first resin. It is usual nowadays to use a resin filled with, for example, $TiO_2$ ("white resin") for the second layer, which resin of itself has reflective properties.

The manufacturing processes of photocouplers generally comprise as their last step the injection molding of an opaque housing followed by its polymerization through baking.

SUMMARY OF THE INVENTION

The invention has for its object to provide a photocoupler through the use of a pre-formed housing in which the electrical and optoelectronic elements constituting the said photocoupler as well as the resins are accommodated.

The manufacture may be made simpler and quicker in this way.

To achieve this object, a photocoupler according to the invention is characterized in that it comprises a pre-formed housing comprising a bottom and side walls, the bottom having at least one cavity which receives a first extremity of the first, second, third and fourth pin, and a first, second, third and fourth slot in which central portions of the first, second, third, and fourth pin, respectively, are fitted.

During assembly, a comb carrying the pins and on which the optoelectronic elements are electrically and mechanically interconnected, is introduced into the slots at the level of the central portions of the pins until the ends of the pins are enclosed in their cavities, thus ensuring an exact mechanical positioning of the pins and of the light emitting and light receiving elements.

In an advantageous embodiment, at least one internal wall contiguous to the first end of at least one pin, and it is preferably in mechanical contact with at least a portion of the said first end. The positioning precision of the light emitting and/or light receiving elements is improved by this.

The said slots may advantageously be arranged on two opposing side walls (for housings of the "Dual In Line" or DIL type).

One cavity may be provided for each pin.

A cavity preferably comprises a chamfered entrance.

The pins may be folded back outside the housing parallel to the corresponding side wall of the housing to facilitate the insertion of the pins in a printed circuit.

The invention also relates to a multiple photocoupler comprising aligned individual photocouplers according to the invention as defined above and provided with separating means, preferably formed by a dovetail coupling.

BRIEF DESCRIPTION OF THE DRAWING

The invention will be better understood with reference to the drawing, in which:

FIG. 1a shows a longitudinal section of a photocoupler according to the invention, while FIG. 1b is an enlarged detail of FIG. 1a, and FIG. 1c is a bottom view in cross-section of a modification of FIG. 1a;

FIG. 2 shows a preferred embodiment of a modification of FIGS. 1a to 1c;

FIG. 3 shows a multiple photocoupler comprising individual photocouplers as shown in FIGS. 1 to 1c and/or 2; and FIG. 4 shows an individual photocoupler after separation.

DESCRIPTION OF THE PREFERRED EMBODIMENTS

In FIG. 1a, a photocoupler comprises a housing designated by the general reference numeral 1 and having a bottom 2 and side walls 3. This is a pre-formed housing similar to housings used at present, for example, for components having two lines of connection pins ("DIL" or "Dual In Line"). The use of such a housing renders it possible to use standard equipment for providing the pins 5 to 8 carried by the combs on which the optoelectronic elements are also arranged, i.e. a light receiving element 9 and a light emitting element 10. More particularly, the element 9 is soldered to an end 51 of the pin 5 at 11 in order to connect a first electrode of the element 9 to the pin 5, while its other electrode is put into contact with an end 61 of the electrode 6 by means of a wire 13, for example soldered by thermocompression. The same holds for the element 10 (soldering on the end 71 of the pin 7 at 12, wire 14 for electric contact with the end 81 of the pin 8).

The bottom 2 of the housing 1 has one or several cavities 21, 22 (grooves, hole), preferably chamfered for accommodating the ends 51, 61, 71 and 81 of the pins 5 to 8 (or some of them). The end 51, 61, 71, 81 of each of the pins 5 to 8 is prolonged by a portion bent through 45° (52, 62, 72, 82), and then with a central portion 53, 63, 73, 83 beyond another 45° bend, which central portion is held in a slot 31, 32, 33, 34 provided in the lower portion (opposite bottom 2) of the wall 3. The slots are provided here in two side walls opposite wall 13 for DIL mounting. The cooperation of the cavities 21, 22 with the slots 31, 32, 33, 34 renders a precise positioning of the pins with standard implantation equipment possible, and thus a precise positioning relative to one another, of the optoelectronic elements 9, 10 which have previously been precisely positioned on the edges 51 and 71.

With the bottom 2 of the housing in bottom position and preheated to 100° C., a transparent resin 15 (for example, resin RTV 141 ™ of Rhône Poulenc) is poured in and made to polymerize completely (3 mm at 150° C. for the above-mentioned resin).

Subsequently, a reflecting resin 16 (or one having a refractive index lower than that of the first resin) is poured on the housing preheated to 100° C., this resin having a viscosity which is preferably high in order to avoid any escape through the slots 31, 41, 51, 61 near the central portions 53, 63, 73, 83 of the pins 5 to 8. A reflecting resin may be composed of, for example, 100 parts by weight of ARALDITE F (Ciba-Geigy), 100 parts by weight of curing agent HY906 (Ciba-Geigy), if desired 0,3 parts by weight of an accelerator DY064 (tertiary amine), and finally a charge consisting of 30 parts by weight of $TiO_2$. To improve the adherence to the metal (copper) of the pins, it is particularly advantageous to add an adhesion promoting agent, for example 2 to 3 parts by weight of the silane bridging agent A174 TM (Union Carbide) for the transparent resin RTV 141 TM, or A187 TM for the epoxy resin (ARALDITE F TM). Curing may take place at 150° C. during 24 hours.

After this the cutting operation on the combs, possible bending operations of the soldering tags 54, 64, 74, 84 of the pins 5 to 8 of generally lesser width may take place, etc.

FIG. 1b shows the arrangement of the ends 51, 61, 71, 81 of the pins in more detail. One or several inside walls 4 situated immediately adjacent the said ends permit a better positioning. This is the case where the inside walls 4 can have raised portions 41 which are in mechanical contact with the ends 51, 61, 71, 81 or with only some of them, in order to guide the pins more precisely.

In other words, the cavities 21 and 22 ensure the vertical positioning of the pins, while the slots 31, 32, 33, 34 ensure the lateral positioning of the pins (FIG. 1c shows a photocoupler without wall 4). Moreover, the possible presence of the wall 4 renders it possible to improve the parallel arrangement of the ends 51 and 71 (these are in essence those of the pins 5, 7 which carry the elements 9 and 10 which it is all about), and the raised portions 41 optimize this parallel arrangement.

According to FIGS. 3 and 4, the individual photocouplers may be arranged in line, the housing 1 being for this purpose provided with coupling means such as dovetails (female part 90 and male part 91 in FIGS. 1c and 4). It is to be noted that the manufacture of the photocouplers may be realized by preliminary assembly in line of the empty housings 1, mounting of the pins being readily achievable by means of combs with standard pitch, after which the photocouplers can be individually used, or collectively in any desired number, as required.

It should be noted that the pins in FIG. 3 have been sent outside the housing 1 in such a way that their narrowed tags 54, etc. may be soldered through the holes of a printed circuit.

I claim:

1. A photocoupler comprising a light emitting element and a light receiving element, the light emitting element having a first and a second electrode in electrical contact with a first and a second contact pin, respectively, the first and second pin each having a first end, a second end and a central portion therebetween, and the light emitting element being fixed in position at the first end of one of the first and second pins, the light receiving element having a third and a fourth electrode in electrical contact with a third and a fourth contact pin, respectively, the third and fourth pin each having a first end, a second end and a central portion therebetween, and the light receiving element being fixed in position at the first end of one of the third and fourth pins, the light emitting element and the light receiving element being situated opposite one another and enveloped in a first continuous solid and transparent layer, surrounded at least in part by a second solid layer provided in such a manner as to reflect the light, characterized in that the photocoupler comprises a pre-formed housing comprising a bottom and side walls, the bottom having at least one grooved cavity which receives the tip of the first end of the first, second, third and fourth pin, respectively, and the side walls having a first, second, third and fourth slot in which the central portions of the first, second, third and fourth pin, respectively, are fitted.

2. A photocoupler as claimed in claim 1, characterized in that it comprises at least one inside wall adjoining the first end of at least one of the first, second, third and fourth pins.

3. A photocoupler as claimed in claim 2, characterized in that said inside wall is at least partly in mechanical contact with said first end.

4. A photocoupler as claimed in claim 1, 2 or 3, characterized in that the first, second, third and fourth slot are provided in two opposing side walls.

5. A photocoupler as claimed in claim 1, 2 or 3, characterized in that it comprises a cavity for each pin.

6. A photocoupler as claimed in claim 5, characterized in that said cavity has a chamfered entrance.

7. A photocoupler as claimed in claim 1, 2 or 3, characterized in that outside the housing the pins are folded back parallel to the corresponding side wall of the housing in such a way that the second ends of the pins are adapted to be implanted through holes of a printed circuitboard.

8. A photocoupler as claimed in claim 1, 2 or 3, characterized in that the second solid layer is reflecting.

9. A photocoupler as claimed in claim 8, characterized in that the second solid layer has a refractive index lower than that of the first solid layer.

10. A multiple photocoupler comprising individual photocouplers mounted in alignment, characterized in that the photocouplers are in accordance with claim 1, 2 or 3, and are provided with separating means.

11. A photocoupler as claimed in claim 10, characterized in that said separating means are formed by a dovetail coupling.

* * * * *